US011854830B2

(12) United States Patent
Yoon et al.

(10) Patent No.: US 11,854,830 B2
(45) Date of Patent: Dec. 26, 2023

(54) METHOD OF MANUFACTURING CIRCUIT BOARD

(71) Applicant: HAESUNG DS CO., LTD., Changwon-si (KR)

(72) Inventors: Dong Jin Yoon, Gimhae-si (KR); Sung Il Kang, Gimhae-si (KR); In Seob Bae, Changwon-si (KR)

(73) Assignee: HAESUNG DS CO., LTD., Changwon-si (KR)

( * ) Notice: Subject to any disclaimer, the term of this patent is extended or adjusted under 35 U.S.C. 154(b) by 692 days.

(21) Appl. No.: 17/020,009

(22) Filed: Sep. 14, 2020

(65) Prior Publication Data
US 2021/0217629 A1 Jul. 15, 2021

(30) Foreign Application Priority Data

Jan. 15, 2020 (KR) .................... 10-2020-0005598

(51) Int. Cl.
| *H01L 21/48* | (2006.01) |
| *H01L 23/498* | (2006.01) |
| *C25D 5/02* | (2006.01) |
| *G03F 7/16* | (2006.01) |
| *G03F 7/42* | (2006.01) |
| *H01L 23/495* | (2006.01) |

(52) U.S. Cl.
CPC .......... *H01L 21/4828* (2013.01); *C25D 5/022* (2013.01); *G03F 7/164* (2013.01); *G03F 7/422* (2013.01); *H01L 21/4839* (2013.01); *H01L 23/49582* (2013.01); *H01L 23/49861* (2013.01)

(58) Field of Classification Search
CPC ............. H01L 21/4828; H01L 21/4839; H01L 23/49582; C25D 5/022; G03F 7/164; G03F 7/422
See application file for complete search history.

(56) References Cited

U.S. PATENT DOCUMENTS

| 9,171,789 B2 | 10/2015 | Shin et al. |
| 9,363,214 B2 * | 6/2016 | Krishna .................. G06F 16/41 |
| 10,573,616 B2 * | 2/2020 | Lin .......................... H01L 24/16 |

(Continued)

FOREIGN PATENT DOCUMENTS

| KR | 20090039528 A | 4/2009 |
| KR | 20140111506 A | 9/2014 |
| KR | 101999594 B1 | 10/2019 |

OTHER PUBLICATIONS

Office Action of Korean Patent Application No. 10-2020-0005598 dated Feb. 25, 2021, 7 pgs.

*Primary Examiner* — Hung V Nguyen
(74) *Attorney, Agent, or Firm* — Schwabe Williamson & Wyatt

(57) ABSTRACT

A method of manufacturing a circuit board includes preparing a substrate having electrical conductivity, removing a portion of a first surface of the substrate to form a plurality of pillars on the first surface of the substrate, locating an insulating material on the first surface of the substrate to cover a space between the plurality of pillars of the substrate, forming a pattern on a second surface, which is opposite to the first surface of the substrate, by removing a portion of the second surface of the substrate, forming a first metal layer on the first surface of the substrate, and forming a second metal layer on the second surface of the substrate.

19 Claims, 10 Drawing Sheets

(56) References Cited

U.S. PATENT DOCUMENTS

| | | | |
|---|---|---|---|
| 2014/0102767 A1* | 4/2014 | Kang | H05K 1/0298 216/13 |
| 2015/0087115 A1* | 3/2015 | Hsu | H01L 21/481 438/126 |
| 2019/0267315 A1 | 8/2019 | Bae et al. | |

* cited by examiner

METHOD OF MANUFACTURING CIRCUIT BOARD

CROSS-REFERENCE TO RELATED APPLICATION

This application claims the benefit of Korean Patent Application No. 10-2020-0005598, filed on Jan. 15, 2020, in the Korean Intellectual Property Office, the disclosure of which is incorporated herein in its entirety by reference.

BACKGROUND

1. Field

One or more embodiments relate to a method of manufacturing a circuit board, and more particularly, to a method of manufacturing a circuit board with high reliability.

2. Description of Related Art

A circuit board is essentially included in an electronic component such as a semiconductor package, and there is a demand for technology for manufacturing a circuit board with high reliability suitable for an operating environment, electronic circuit characteristics, etc. of a product using the circuit board.

A general method of manufacturing a circuit board may involve entirely or partially plating a bonding area and a pad area of an upper surface of a lead frame of the circuit board with silver (Ag) and not plating a lower surface of the lead frame. According to the general method, adequate soldering performance may be guaranteed in a copper wire bonding process for connecting a semiconductor chip to the bonding area of the upper surface of the lead frame that is plated with silver.

However, because the lower surface of the lead frame is not plated, the lower surface of the lead frame including copper or a copper alloy material is exposed to the outside. Accordingly, adequate soldering performance on the lower surface of the lead frame may not be guaranteed in a subsequent semiconductor assembly process, and thus, reliability may be reduced during temperature cycling. Therefore, in order to improve soldering performance between the semiconductor chip and the lead frame in the subsequent semiconductor assembly process, a process of additionally plating the lower surface of the lead frame is required. However, even when an additional plating process is performed to improve soldering performance, intermetallic compound (IMC) characteristics of an already completed circuit board may not be good, and thus, reliability may still be reduced during temperature cycling and there are limitations in applying this method to, for example, semiconductor products for automobiles requiring high reliability.

Another method of manufacturing a circuit board may involve entirely or partially plating an upper surface and a lower surface of a lead frame with a metal material. The method may have the advantage that reliability is improved during temperature cycling because soldering performance on the lower surface of the lead frame is improved, but may have the disadvantage that copper wire bonding performance between a semiconductor chip and a bonding area of the lead frame is reduced, that is, adherence is insufficient.

SUMMARY

One or more embodiments provide a method of manufacturing a circuit board with high reliability.

One or more embodiments provide a method of manufacturing a circuit board which improves temperature cycling reliability by improving copper wire bonding performance between a semiconductor chip and the circuit board and also improving soldering performance of the circuit board in a semiconductor assembly process.

Additional aspects will be set forth in part in the description which follows and, in part, will be apparent from the description, or may be learned by practice of the presented embodiments of the disclosure.

According to one or more embodiments, a method of manufacturing a circuit board includes preparing a substrate having electrical conductivity, removing a portion of a first surface of the substrate to form a plurality of pillars on the first surface of the substrate, locating an insulating material on the first surface of the substrate to cover a space between the plurality of pillars of the substrate, forming a pattern on a second surface, which is opposite to the first surface of the substrate, by removing a portion of the second surface of the substrate, forming a first metal layer on the first surface of the substrate, and forming a second metal layer on the second surface of the substrate.

The removing of the portion of the first surface may include removing the portion of the first surface of the substrate by using a half-etching process.

A thickness of a remaining portion of the substrate after the portion of the first surface of the substrate is removed by the removing of the portion of the first surface may be equal or greater than 35 µm.

The method may further include, between the removing of the portion of the first surface and the locating of the insulating material on the first surface of the substrate, performing surface treatment for roughening the first surface of the substrate by using a plating process or an etching process.

The method may further include, after the locating of the insulating material on the first surface and before the forming of the pattern on the second surface, curing the insulating material.

The method may further include, after the curing of the insulating material and before the forming of the pattern on the second surface, removing a portion of the insulating material to expose an end surface of each of the plurality of pillars.

A height difference between an outer surface of the insulating material and the exposed end surface of the pillar on the first surface of the substrate may be less than 10 µm.

The forming of the pattern on the second surface may include locating a pattern mask corresponding to the pattern on the second surface and then performing an exposure process and a developing process, and removing a portion of the second surface of the substrate by spraying a copper chloride etching solution to the second surface of the substrate.

The forming of the first metal layer and the forming of the second metal layer may use different metal materials, so that the first metal layer and the second metal layer include different metal materials.

The forming of the first metal layer may include forming a second surface insulating layer by using an electrically insulating material to cover the second surface of the substrate, and locating the first metal layer on an end surface of each of the plurality of pillars of the first surface of the substrate by using a plating method using at least one material selected from the group consisting of nickel, a nickel alloy, palladium, a palladium alloy, and a gold alloy.

The forming of the first metal layer may further include removing the second surface insulating layer after the locating of the first metal layer.

The forming of the second metal layer may include forming a first surface insulating layer by using an electrically insulating material to cover the first surface of the substrate, and locating the second metal layer on at least a portion of the pattern of the second surface of the substrate by using a plating method using a silver (Ag) material.

The forming of the second metal layer may further include removing the first surface insulating layer after the locating of the second metal layer including the silver material.

The forming of the first metal layer may include forming the first metal layer to cover the whole of an end surface of each of the plurality of pillars.

The forming of the second metal layer may include forming the second metal layer to cover at least a portion of the pattern of the second surface of the substrate.

The forming of the first metal layer may include forming a second surface temporary conductive layer on the second surface of the substrate, forming a second surface insulating layer to cover the second surface temporary conductive layer of the second surface of the substrate, and locating the first metal layer on an end surface of each of the plurality of pillars of the first surface of the substrate by using a plating method using at least one material selected from the group consisting of nickel, a nickel alloy, palladium, a palladium alloy, and a gold alloy.

The forming of the first metal layer may include removing the second surface insulating layer and the second surface temporary conductive layer after the locating of the first metal layer.

The forming of the second metal layer may include forming a first surface temporary conductive layer on the first surface of the substrate, forming a first surface insulating layer to cover the first surface temporary conductive layer of the first surface of the substrate, and locating a second metal layer on at least a portion of the pattern of the second surface of the substrate by using a plating method using a silver (Ag) material.

The forming of the second metal layer may further include removing the first surface insulating layer and the first surface temporary conductive layer after the forming of the second metal layer including the silver material.

The removing of the portion of the first surface of the substrate may include forming a wettable flank as a concave groove along with the plurality of pillars in a portion of the first surface of the substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
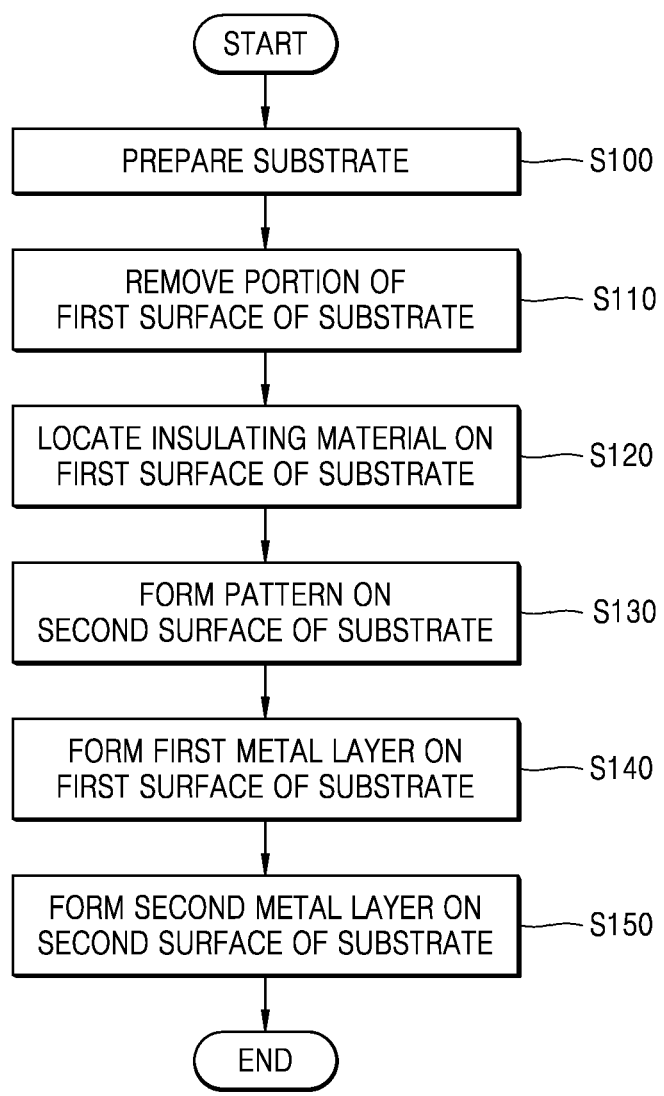
FIG. 1 is a flowchart illustrating operations of a method of manufacturing a circuit board according to an embodiment of the disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The disclosure will now be described more fully with reference to the accompanying drawings, in which embodiments of the disclosure are shown. The disclosure may, however, be embodied in many different forms and should not be construed as being limited to the embodiments set forth herein; rather, these embodiments are provided so that this disclosure will be thorough and complete and will fully convey the concept of the disclosure to one of ordinary skill in the art, and the disclosure will only be defined by the appended claims. The terms used herein are merely used to describe embodiments, and are not intended to limit the disclosure. The singular forms "a," "an," and "the" are intended to include the plural forms as well, unless the context clearly indicates otherwise. It will be further understood that the terms "comprises" and/or "comprising" used herein specify the presence of stated components, steps, operations, and/or elements, but do not preclude the presence or addition of one or more other components, steps, operations, and/or elements. While such terms as "first," "second," etc., may be used to describe various components, such components must not be limited to the above terms. The above terms are used only to distinguish one component from another.

FIG. 1 is a flowchart illustrating operations of a method of manufacturing a circuit board according to an embodiment of the disclosure.

The method of manufacturing the circuit board according to an embodiment of FIG. 1 includes operation S100 in which a substrate having electrically conductivity is prepared, operation S110 in which a portion of a first surface of the substrate is removed to form a plurality of pillars on the first surface of the substrate, operation S120 in which an insulating material is located on the first surface of the substrate to cover a space between the pillars of the substrate, operation S130 in which a pattern is formed on a second surface that is opposite to the first surface by removing a portion of the second surface of the substrate, operation S140 in which a first metal layer is formed on the first surface of the substrate, and operation S150 in which a second metal layer is formed on the second surface of the substrate.

Operation S140 in which the first metal layer is formed on the first surface of the substrate and operation S150 in which the second metal layer is formed on the second surface of the substrate are not necessarily performed in the order of FIG.

1, and, for example, operation S140 in which the first metal layer is formed on the first surface of the substrate may be performed after operation S150 in which the second metal layer is formed on the second surface of the substrate.

According to the method of manufacturing the circuit board according to an embodiment of FIG. 1, a lead frame of a semiconductor package may be manufactured by using the substrate having electrical conductivity. The 'lead frame' is a circuit board manufactured by using the method of manufacturing the circuit board according to embodiments, and a lower surface of the lead frame corresponds to a first surface of the circuit board and an upper surface of the lead frame corresponds to a second surface that is opposite to the first surface of the circuit board.

The whole or a portion of the upper surface of the lead frame (corresponding to the second surface of the substrate) and the whole or a portion of a side surface and the upper surface of the lead frame may be plated with a material including silver (Ag) or a silver alloy.

Also, the lower surface of the lead frame (corresponding to the first surface of the circuit board) may be plated with a material different from silver (Ag). For example, the lower surface of the lead frame may be plated with at least one material selected from the group consisting of nickel, a nickel alloy, palladium, a palladium alloy, and a gold alloy.

According to the method of manufacturing the circuit board, copper wire bonding performance between a semiconductor chip and a bonding pad of the upper surface of the lead frame may be improved. Also, soldering performance on the lower surface of the lead frame may be improved in a semiconductor assembly process.

FIGS. 2 through 16 are cross-sectional views illustrating operations of a method of manufacturing a circuit board according to an embodiment of FIG. 1.

Figure 2:
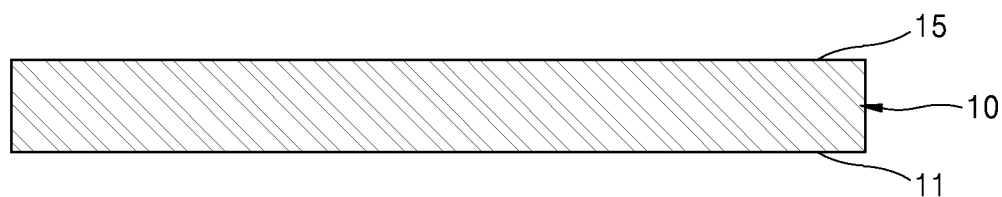
FIGS. 2 through 16 are cross-sectional views illustrating operations of the method of manufacturing the circuit board of FIG. 1.

As shown in FIG. 2, an operation of preparing a substrate 10 made of a material including an electrically conductive metal, for example, copper (Cu) or a copper alloy, is performed. In FIG. 2, a bottom surface of the substrate 10 is a first surface 11, and a top surface of the substrate 10 is a second surface 15. For example, the substrate 10 may be a base film for a rigid circuit board, or a thin soft base film for a flexible printed circuit board (FPCB).

Figure 3:
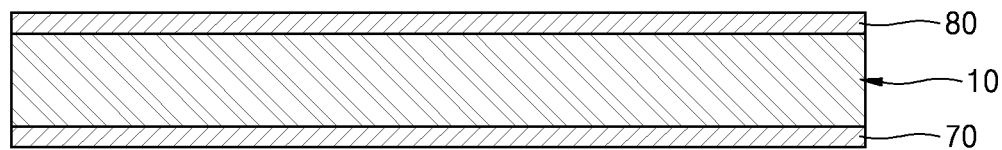

Referring to FIG. 3, resist layers 70 and 80 are respectively located on the first surface 11 and the second surface 15 of the substrate 10 after the substrate 10 is prepared. The resist layers 70 and 80 may be, for example, photoresists that are sensitive to light.

Figure 4:
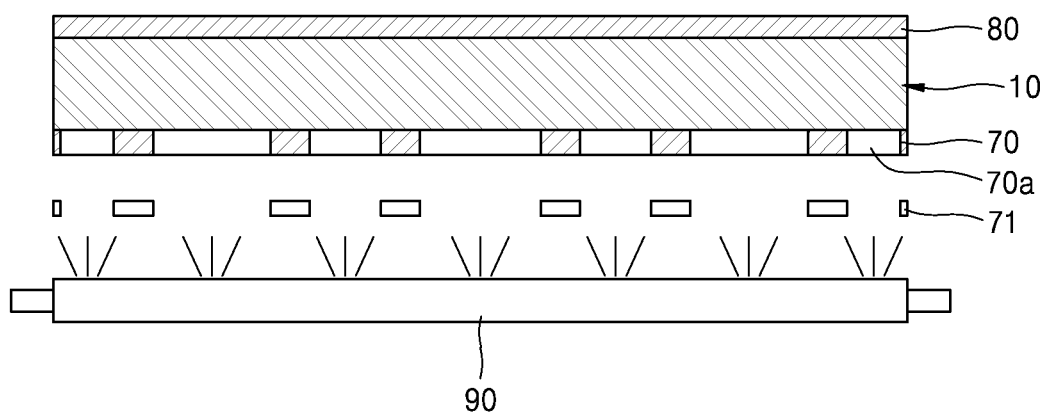

Referring to FIG. 4, a mask 71 is located to correspond to the resist layer 70 located on the first surface 11 of the substrate 10, and an exposure area 70a is formed in the resist layer 70 by performing an exposure process of emitting light to the resist layer 70 on the first surface 11 of the substrate 10 through the mask 71 by using a light source 90. By causing a developing solution to contact the resist layer 70 having the exposure area 70a formed through the exposure process, the exposure area 70a is removed and only a portion of the resist layer 70 remains. Embodiments are not limited to a positive photosensitive method of FIG. 4, and a negative method of removing a portion of the resist layer exposed to light may be used.

Figure 5:
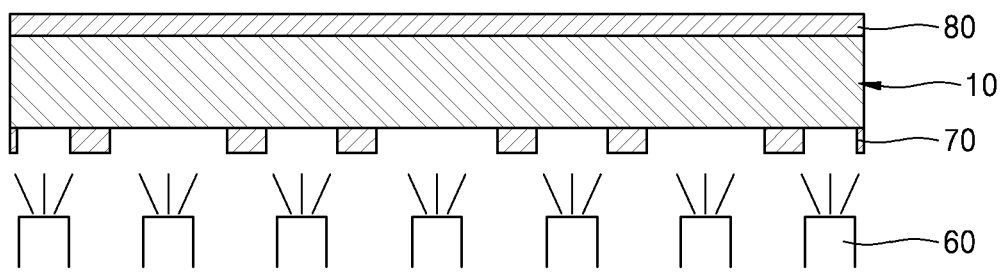

Referring to FIG. 5, an operation of removing a portion of the first surface 11 of the substrate 10 is performed. In the operation of removing the portion of the first surface 11 of the substrate 10, the portion of the first surface 11 of the substrate 10 exposed to the outside when the portion of the resist layer 70 is removed may be removed by using a half-etching process. As the half-etching process, a spraying method of spraying a copper chloride etching solution including copper (Cu) or a copper alloy material to the first surface 11 of the substrate 10 through a nozzle 60 may be used.

Figure 6:
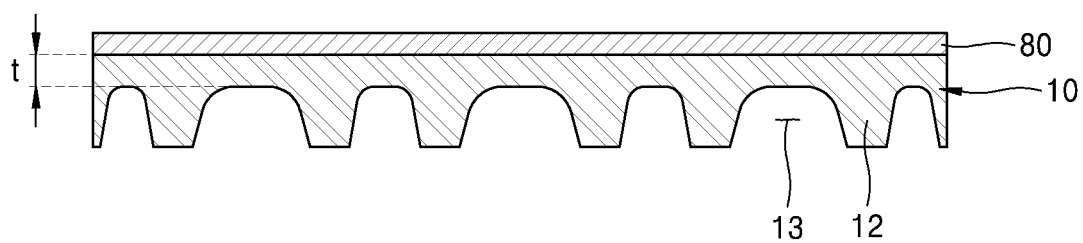

FIG. 6 illustrates the substrate 10 having a plurality of pillars 12 formed on the first surface 11 by removing the portion of the first surface 11 of the substrate 10 by using the half-etching process. Each pillar 12 completed is formed of the same material as that of the substrate 10, and thus, may include copper or a copper alloy material. A space 13 is formed between the plurality of pillars 12 when the portion of the first surface 11 of the substrate 10 is removed.

In the operation of removing the portion of the first surface 11 of the substrate 10 to form the pillars 12, a thickness 't' of a support layer of the substrate 10 that supports the pillar 12 to prevent deformation and warping of the substrate 10 may be equal to or greater than 35 μm. The support layer of the substrate 10 corresponds to a remaining portion of the substrate 10 after the portion of the first surface 11 of the substrate 10 is removed.

Figure 7:
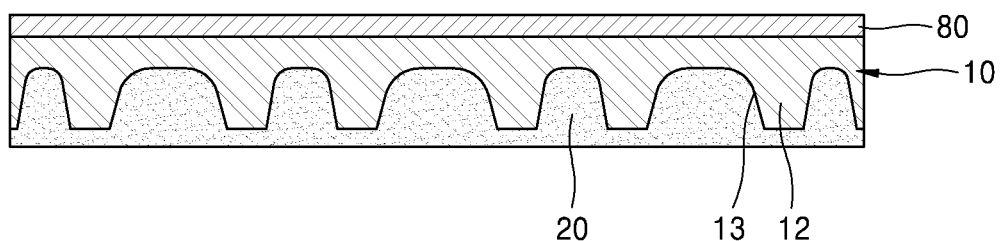

Referring to FIG. 7, after the portion of the first surface 11 of the substrate 10 is removed, an operation of locating an insulating material 20 on the first surface 11 of the substrate 10 to cover the space 13 between the pillars 12 of the substrate 10 is performed. The insulating material 20 may include a material not having electrical conductivity, for example, an insulating resin. As the insulating resin, a liquid resin, a tape including a resin component, or powder including a resin component may be used. After the insulating material 20 is located on the first surface 11 of the substrate 10, an operation of curing the insulating material 20 may be performed.

Between the operation of removing the portion of the first surface 11 of the substrate 10 of FIG. 6 and the operation of locating the insulating material 20 of FIG. 7, a surface treatment operation of roughening the first surface 11 of the substrate 10 may be performed. The surface treatment operation is an operation of roughening a surface in the space 13 between the pillars 12 of the first surface 11 of the substrate 10 to improve adherence between the insulating material 20 and the first surface 11 of the substrate 10. The surface treatment operation may be an operation of forming fine protrusions on the first surface 11 of the substrate 10 by using a plating process or forming fine concave grooves in the first surface 11 of the substrate 10 by using an etching process.

Figure 8:
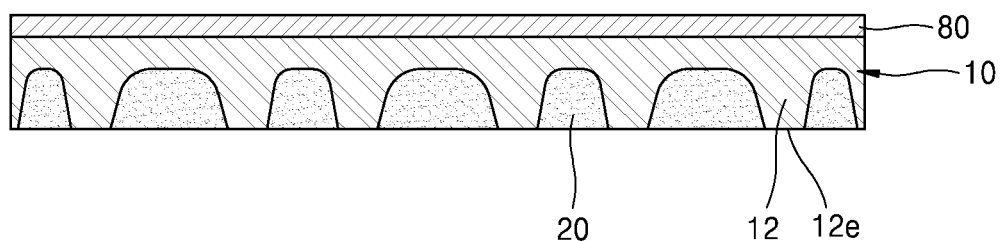

Referring to FIG. 8, after the insulating material 20 is located on the first surface 11 of the substrate 10, an operation of removing a portion of an exposed surface of the insulating material 20 may be performed. The operation of removing the portion of the exposed surface of the insulating material 20 may include a scrubbing operation of removing and planarizing the portion of the insulating material 20 on the first surface 11 of the substrate 10 to expose an end surface 12e of each pillar 12. In the operation of removing the portion of the insulating material 20 on the first surface 11 of the substrate 10, a height difference between a surface of the insulating material 20 whose portion is removed and a protruding portion of the pillar 12 may be less than 10 μm.

Figure 9:
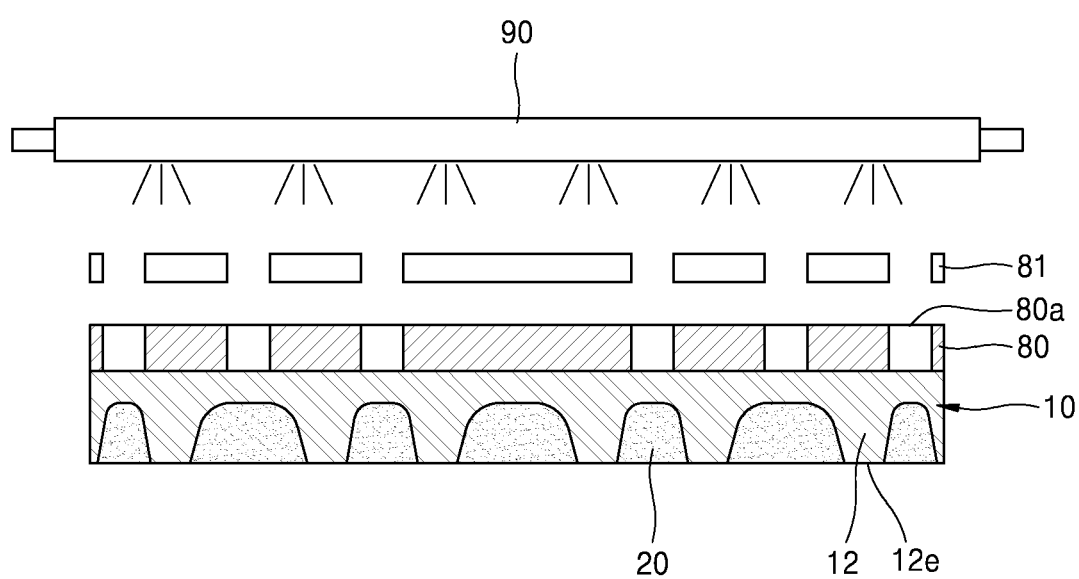

Referring to FIG. 9, as a part of an operation of forming a pattern on the second surface 15 of the substrate 10, a pattern mask 81 is located to correspond to the resist layer 80 located on the second surface 15 of the substrate 10, and an exposure area 80a is formed in the resist layer 80 by performing an exposure process of emitting light to the resist layer 80 on the second surface 15 of the substrate 10 through the pattern mask 81 by using the light source 90. By causing a developing solution to contact the resist layer 80 having the exposure area 80a formed through the exposure process, a developing process of removing the exposure area 80a is performed and only a portion of the resist layer 80 remains. Embodiments are not limited to a positive photosensitive method of FIG. 9, and a negative method of removing a portion of the resist layer exposed to light may be used.

Figure 10:
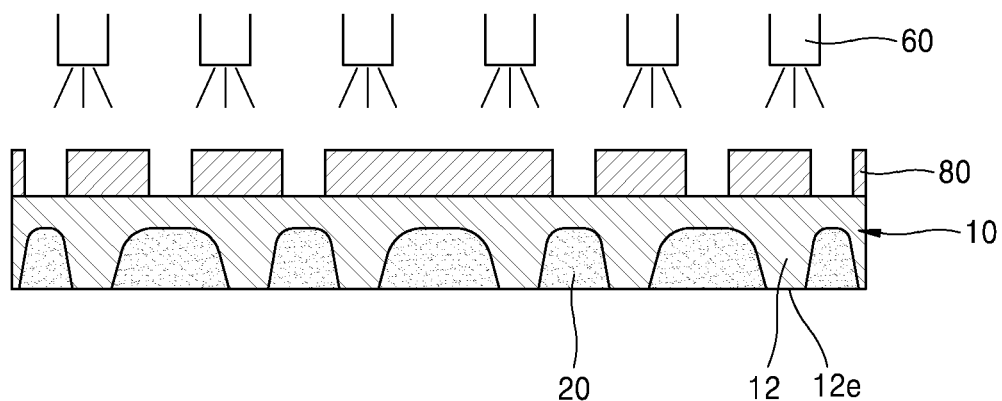

Referring to FIG. 10, as a part of the operation of forming the pattern on the second surface 15 of the substrate 10, an operation of removing a portion of the second surface 15 of the substrate 10 is performed. In the operation of removing the portion of the second surface 15 of the substrate 10, the portion of the second surface 15 of the substrate 10 exposed to the outside when the portion of the resist layer 80 is removed may be removed by using a half-etching process. As the half-etching process, a spraying method of spraying a copper chloride etching solution including copper (Cu) or a copper alloy material to the second surface 15 of the substrate 10 through the nozzle 60 may be used.

Figure 11:
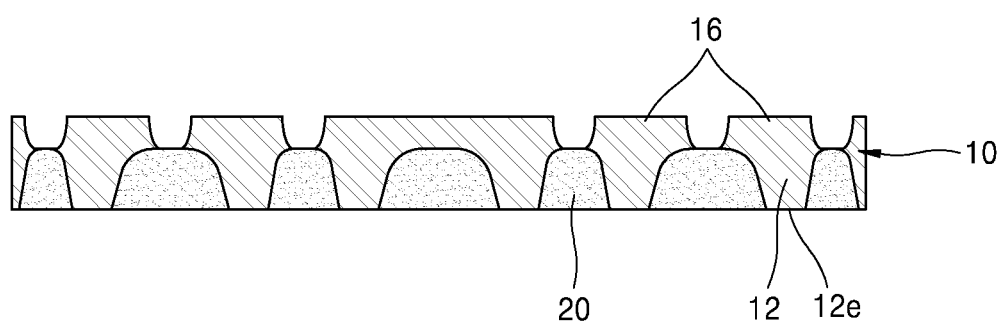

FIG. 11 illustrates the substrate 10 having a pattern 16 formed on the second surface 15 by removing the portion of the second surface 15 of the substrate 10 by using the half-etching process.

Figure 12:
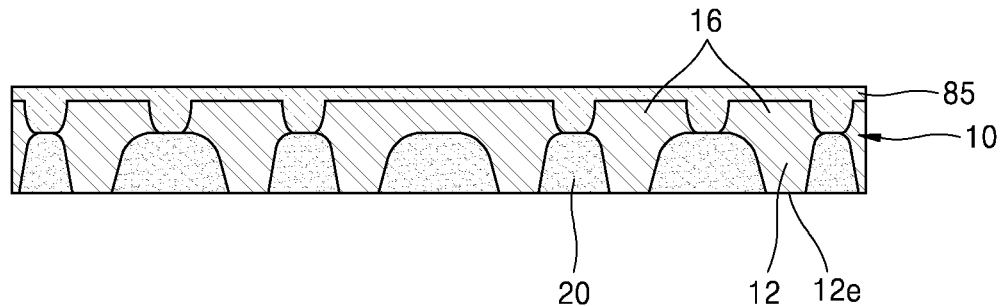
Figure 13:
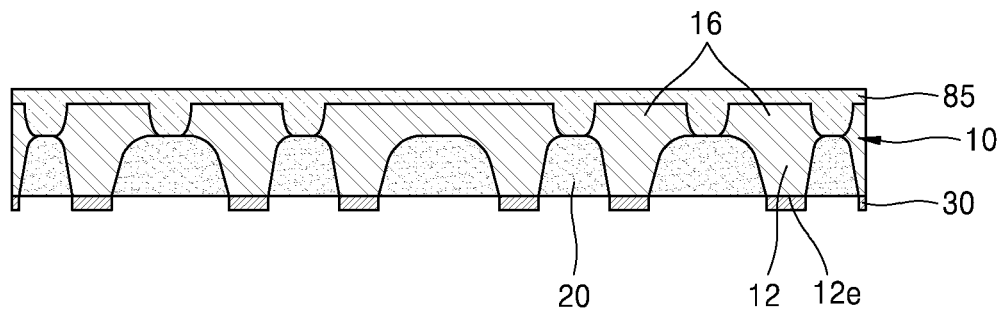

FIGS. 12 and 13 illustrate an operation of forming a first metal layer 30 on the first surface 11 of the substrate 10. Referring to FIG. 12, first, an operation of locating a second surface insulating layer 85 on the second surface 15 of the substrate 10 is performed. The second surface insulating layer 85 may include an electrically insulating resin. The second surface insulating layer 85 is located to cover the whole of the second surface 15 of the substrate 10 including the pattern 16. The second surface insulating layer 85 protects the second surface 15 of the substrate 10 while the operation of locating the first metal layer 30 on the first surface 11 of the substrate 10 is performed as described below.

Referring to FIG. 13, an operation of locating the first metal layer 30 on the end surface 12e of the pillar 12 exposed to the outside on the first surface 11 of the substrate 10 is performed. The first metal layer 30 is located to cover the whole of the end surface 12e of the pillar 12 exposed to the outside on the first surface 11 of the substrate 10. Embodiments are not limited to a method of locating the first metal layer 30 of FIG. 13, and, for example, the first metal layer 30 may be located to cover only a portion of the end surface 12e of the pillar 12.

In the operation of locating the first metal layer 30 on the end surface 12e of the pillar 12, for example, electroplating may be used. That is, the first metal layer 30 including at least one material selected from the group consisting of nickel, a nickel alloy, palladium, a palladium alloy, and a gold alloy may be plated on the end surface 12e of the pillar 12 by applying current to the substrate 10. After the operation of locating the first metal layer 30 on the end surface 12e of the pillar 12 is completed, an operation of removing the second surface insulating layer 85 may be performed.

Figure 14:
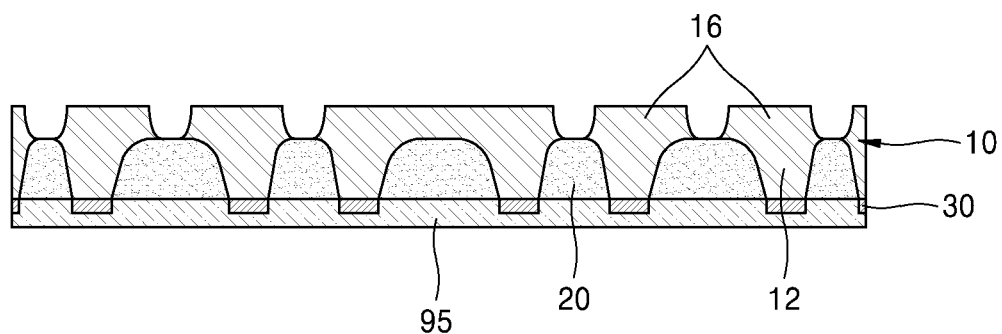
Figure 15:
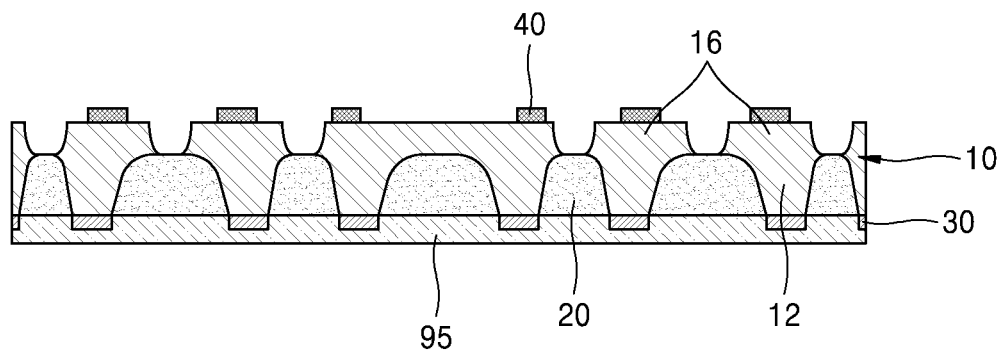

FIGS. 14 and 15 illustrate an operation of forming a second metal layer 40 on the second surface 15 of the substrate 10. Referring to FIG. 14, first, an operation of forming a first surface insulating layer 95 including an electrically insulating material such as an electrically insulating resin material on the first surface 11 of the substrate 10 is performed. The first surface insulating layer 95 is formed to cover the whole of the first surface 11 of the substrate 10. The first surface insulating layer 95 protects the first surface 11 of the substrate 10 while the operation of locating the second metal layer 40 on the second surface 15 of the substrate 10 is performed as described below.

Referring to FIG. 15, an operation of locating the second metal layer 40 to cover at least a portion of the pattern 16 on the second surface 15 of the substrate 10 is performed.

In the operation of locating the second metal layer 40 on the pattern 16 of the substrate 10, for example, electroplating may be used. That is, the second metal layer 40 including silver (Ag) or a silver alloy material may be plated on the pattern 16 by applying current to the substrate 10. After the operation of locating the second metal layer 40 is completed, the first surface insulating layer 95 may be removed.

Because the operation of forming the first metal layer 30 and the operation of forming the second metal layer 40 use different metal materials as described above, the first metal layer 30 formed on the first surface 11 of the substrate 10 and the second metal layer 40 formed on the second surface 15 of the substrate 10 include different metal materials. For example, because the first metal layer 30 includes at least one material selected from the group consisting of nickel, a nickel alloy, palladium, a palladium alloy, and a gold alloy, an electrical connection structure between the first surface 11 of the substrate 10 and another electronic component may be firmly completed when a semiconductor assembly process is performed by using the substrate 10. Also, because the second metal layer 40 includes silver or a silver alloy, improved soldering performance may be achieved when the substrate 10 and a semiconductor chip are electrically connected by locating the semiconductor chip on the first surface 11 of the substrate 10.

Figure 16:
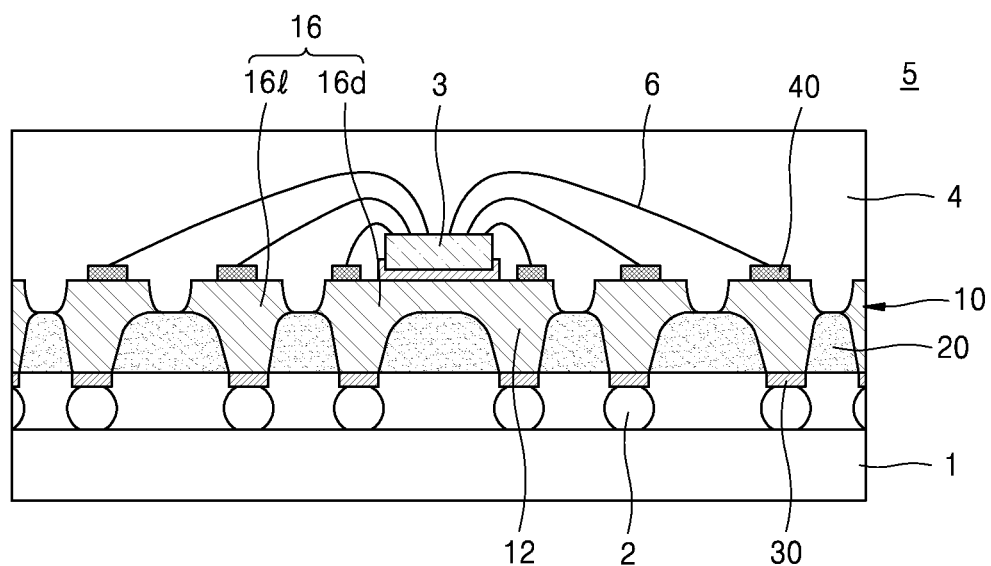

FIG. 16 illustrates a semiconductor assembly process of assembling a semiconductor package 5 including a circuit board completed by operations of FIGS. 2 through 15 on a control substrate 1 according to an embodiment of the disclosure.

The semiconductor package 5 is completed by locating a semiconductor chip 3 on a bonding area of the second surface 15 of the substrate 10, electrically connecting the semiconductor chip 3 and the pattern 16 on the second surface 15 of the substrate 10 by using a conductive wire 6, and forming a molding portion 4 for sealing the semiconductor chip 3.

Because the second metal layer 40 including a silver (Ag) material is formed on the pattern 16 on the second surface 15 of the substrate 10 when the semiconductor chip 3 and the substrate 10 are electrically connected to each other by using the conductive wire 6, the conductive wire 6 may be stably connected to the pattern 16. Because soldering performance between the conductive wire 6 and the pattern 16 is excellent, mechanical robustness and electrical stability may be ensured and thus the overall reliability of the semiconductor package 5 is improved.

Because the first metal layer 30 including at least one material selected from the group consisting of nickel, a nickel alloy, palladium, a palladium alloy, and a gold metal is formed on the first surface 11 of the substrate 10, a metal plating process does not need to be additionally performed when the semiconductor package 5 is mounted on the control substrate 1. Also, soldering performance between the first metal layer 30 on the first surface 11 of the substrate 10 and the control substrate 1 is improved when the semiconductor package 5 is mounted on the control substrate 1, the overall reliability of an electronic product including the semiconductor package 5 is improved.

Figure 17:
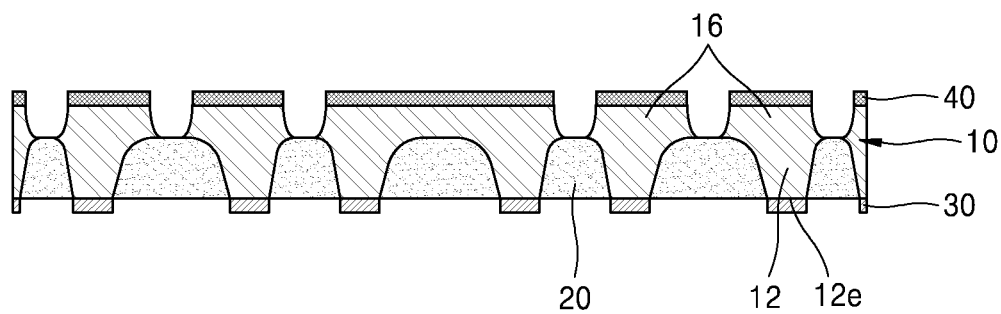
FIG. 17 is a cross-sectional view illustrating some operations of a method of manufacturing a circuit board according to another embodiment of the disclosure.

FIG. 17 is a cross-sectional view illustrating some operations of a method of manufacturing a circuit board according to another embodiment of the disclosure.

FIG. 17 is a cross-sectional view of the substrate 10 corresponding to an operation of forming the second metal layer 40 on the second surface 15 of the substrate 10 of FIG. 15 from among operations of a method of manufacturing a circuit board according to an embodiment of FIGS. 2 through 15.

Referring to FIG. 17, the second metal layer 40 is formed to cover the whole of the pattern 16 formed on the second surface 15 of the substrate 10, unlike in the method of manufacturing the circuit board according to an embodiment of FIGS. 2 through 15.

While the second metal layer 40 is formed to cover a portion of the pattern 16 formed on the second surface 15 of the substrate 10 in the method of manufacturing the circuit board according to an embodiment of FIG. 15, the second metal layer 40 is formed to cover the whole of the pattern 16 formed on the second surface 15 of the substrate 10 in the method of manufacturing the circuit board of FIG. 17.

Embodiments are not limited to a method of forming the second metal layer 40 in the method of manufacturing the circuit board of any of FIGS. 15 and 17, and when the second metal layer 40 is formed on the second surface 15 of the substrate 10, for example, the second metal layer 40 may be formed to cover the whole or a portion of an upper surface of the pattern 16 formed on the second surface 15 of the substrate 10 or the second metal layer 40 may be formed to cover up to at least a portion of a side surface of the pattern 16.

FIGS. 18 through 24 are cross-sectional views illustrating operations of a method of manufacturing a circuit board according to another embodiment of the disclosure.

The method of manufacturing the circuit board according to an embodiment of FIGS. 18 through 24 is similar to a method of manufacturing a circuit board according to an embodiment of FIGS. 2 through 15.

In the method of manufacturing the circuit board according to an embodiment of FIGS. 2 through 15, for example, a bus exists on a substrate for the purpose of applying electricity while a plating process is performed on a pad area and a land of a lead frame.

However, in the method of manufacturing the circuit board according to an embodiment of FIGS. 18 through 24, a busless substrate structure with no trace for connection to a pad area or a land of a lead frame is used.

Figure 18:
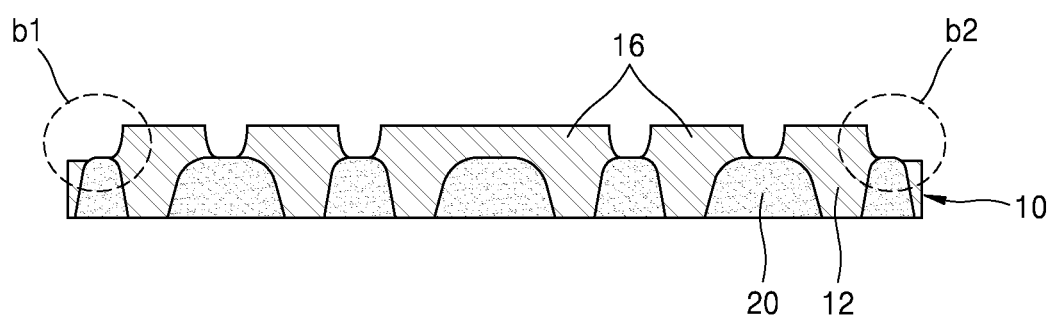
FIGS. 18 through 24 are cross-sectional views illustrating operations of a method of manufacturing a circuit board according to another embodiment of the disclosure.

FIG. 18 is a cross-sectional view of the substrate 10 made by performing operations of FIGS. 2 through 10. The substrate 10 of FIG. 18 includes the insulating material 20 that fills a space between the plurality of pillars 12 on the first surface 11 and includes the pattern 16 on the second surface 15. Buses for a plating process are not provided on both edges b1 and b2 of the pattern 16.

A lead frame that is a component of a circuit board manufactured by using a metal material as a raw material substrate has the advantage that heat dissipation performance is high because the lead frame is formed of a metal material and thus has high thermal conductivity, but has the disadvantage that an arrangement density of in/out ports is low when the lead frame is used in a semiconductor package. Accordingly, when a lead frame having a structure including a bus used in a plating process, a space for locating the bus is further required, and thus there may be limitations in securing a space between lands and depths of patterns etched in an etching process. That is, in the lead frame including the bus, space utilization is limited, and thus, are limitations in manufacturing a fine circuit pattern.

In contrast, when a lead frame having a busless structure with no bus is used, more in/out ports may be arranged, which is advantageous for manufacturing a fine circuit pattern.

Operations of the method of manufacturing the circuit board according to an embodiment of FIGS. 18 through 24 are operations of a method of manufacturing a circuit board using a lead frame having a busless structure.

Figure 19:
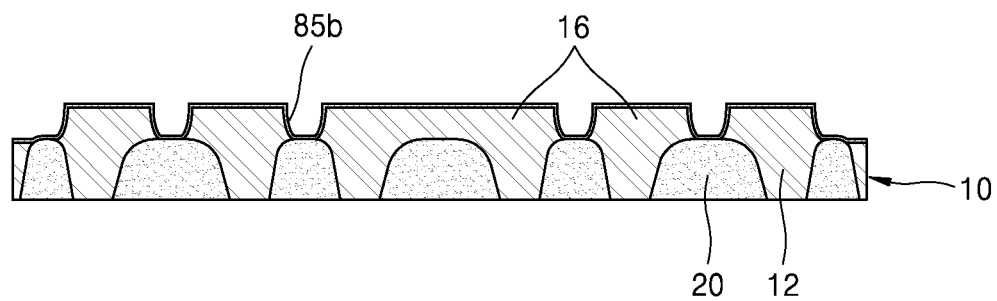
Figure 20:
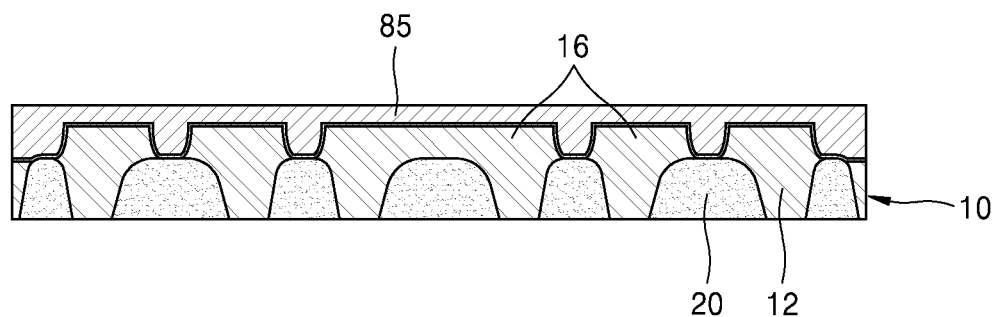
Figure 21:
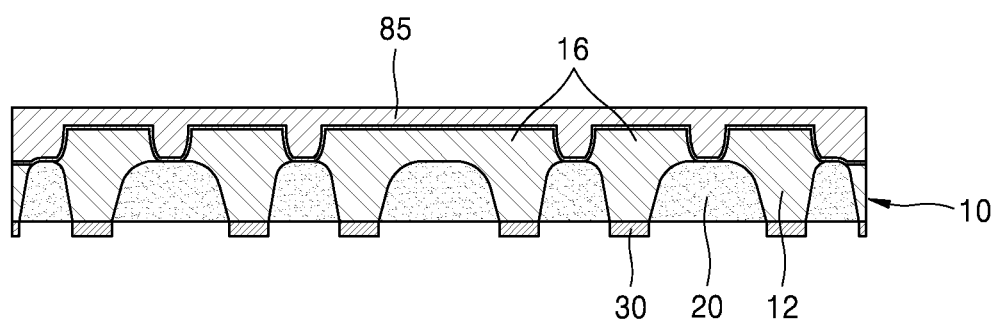

FIGS. 19 through 21 illustrate an operation of forming the first metal layer 30 on the first surface 11 of the substrate 10. In FIG. 19, a second surface temporary conductive layer 85b covering the whole of the second surface 15 of the substrate 10 including the pattern 16 is formed. The second surface temporary conductive layer 85b may be formed by using, for example, copper sputtering.

Referring to FIG. 20, after the second surface temporary conductive layer 85b is formed, an operation of locating the second surface insulating layer 85 on the second surface 15 of the substrate 10 to cover the whole of the second surface temporary conductive layer 85b is performed. The second surface insulating layer 85 may include an electrically insulating resin.

The second surface insulating layer 85 protects the second surface 15 of the substrate 10 while the operation of locating the first metal layer 30 on the first surface 11 of the substrate 10 is performed as described below. Also, the second surface temporary conductive layer 85b functions as an electrical conductor for applying current to the substrate 10 while the operation of locating the first metal layer 30 on the first surface 11 of the substrate 10 is performed.

Referring to FIG. 21, an operation of locating the first metal layer 30 on an end surface of the pillar 12 exposed to the outside on the first surface 11 of the substrate 10 is performed. The first metal layer 30 is located to cover the whole of the end surface of the pillar 12 exposed to the outside on the first surface 11 of the substrate 10.

In the operation of locating the first metal layer 30 on the end surface of the pillar 12, for example, electroplating may be used. That is, the first metal layer 30 including at least one material selected from the group consisting of nickel, a nickel alloy, palladium, a palladium alloy, and a gold alloy may be plated on the end surface of the pillar 12 by applying current to the substrate 10 by using the second surface temporary conductive layer 85b. After the operation of locating the first metal layer 30 on the end surface of the pillar 12 is completed, an operation of removing the second surface insulating layer 85 and the second surface temporary conductive layer 85b may be performed.

Figure 22:
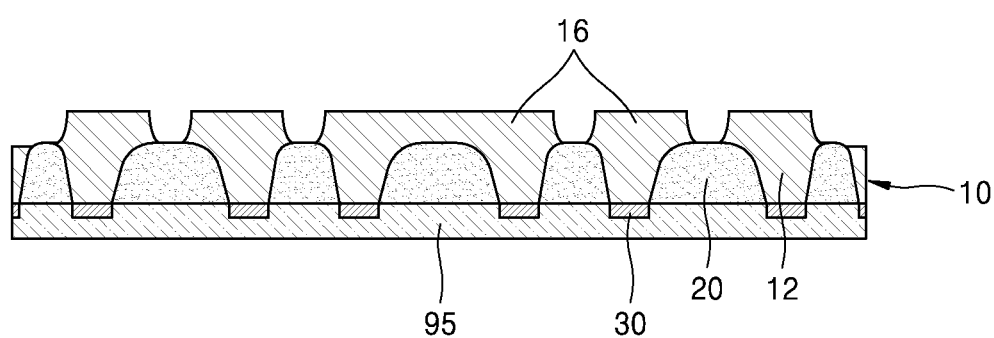
Figure 23:
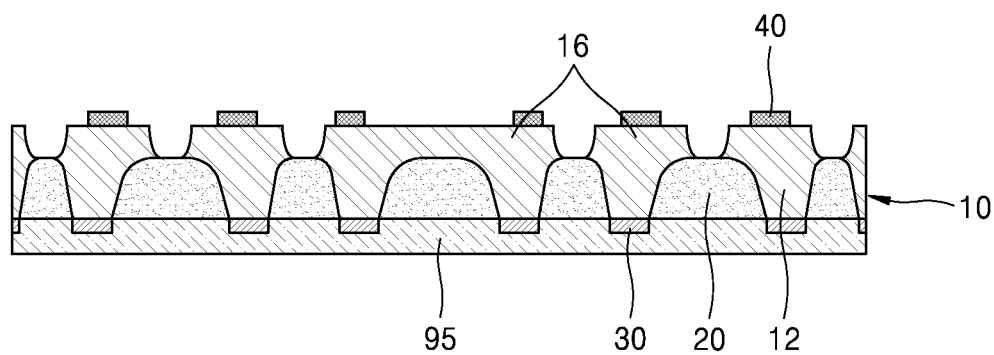
Figure 24:
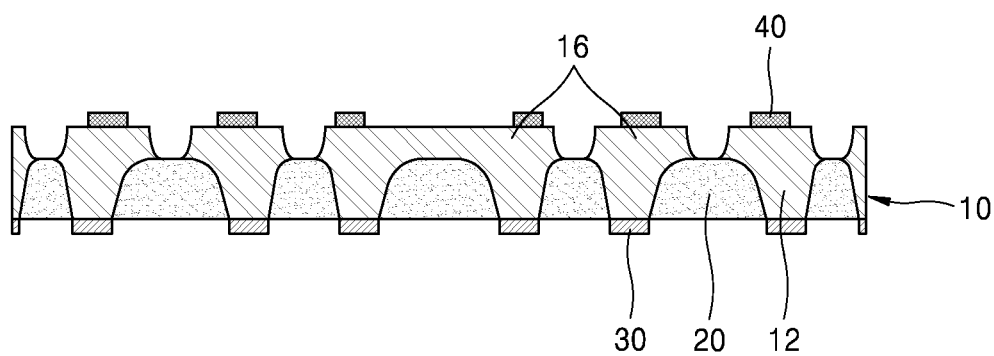

FIGS. 22 through 24 illustrate an operation of forming the second metal layer 40 on the second surface 15 of the substrate 10.

Referring to FIG. 22, after the second surface insulating layer 85 is removed, the first surface insulating layer 95 including an electrically insulating material such as an electrically insulating resin material is formed on the first surface 11 of the substrate 10. The first surface insulating layer 95 is formed to cover the whole of the first surface 11 of the substrate 10.

Before the first surface insulating layer 95 is formed, an operation of locating a first surface temporary conductive layer between the first surface insulating layer 95 and the first surface 11 of the substrate 10 may be performed. The first surface temporary conductive layer may be formed by using, for example, copper sputtering The first surface insulating layer 95 protects the first surface 11 of the substrate 10 while the operation of locating the second metal layer 40 on the second surface 15 of the substrate 10 is performed as described below. Also, the first surface temporary conductive layer formed between the first surface 11 of the substrate 10 and the first surface insulating layer 95 functions as an electrical conductor for applying current to the substrate 10 while the operation of locating the second metal layer 40 on the second surface 15 of the substrate 10 is performed.

Referring to FIG. 23, an operation of locating the second metal layer 40 to cover at least a portion of the pattern 16 on the second surface 15 of the substrate 10 is performed.

In the operation of locating the second metal layer 40 on the pattern 16 of the substrate 10, for example, electroplating may be used. That is, the second metal layer 40 including silver (Ag) or a silver alloy material may be plated on the pattern 16 by applying current to the substrate 10 through the first surface temporary conductive layer formed between the first surface 11 of the substrate 10 and the first surface insulating layer 95. After the operation of locating the second metal layer 40 is completed, an operation of removing the first surface insulating layer 95 and the first surface temporary conductive layer may be performed, to complete a circuit board as shown in FIG. 24.

Because the operation of forming the first metal layer 30 and the operation of forming the second metal layer 40 use different metal materials as described above, the first metal layer 30 formed on a first surface 11 of the substrate 10 and the second metal layer 40 formed on the second surface 15 of the substrate 10 include different metal materials. For example, because the first metal layer 30 includes at least one material selected from the group consisting of nickel, a nickel alloy, palladium, a palladium alloy, and a gold alloy, an electrical connection structure between the first surface 11 of the substrate 10 and another electronic component may be firmly completed when a semiconductor assembly process is performed by using the substrate 10. Also, because the second metal layer 40 includes silver or a silver alloy, improved soldering performance may be achieved when the substrate 10 and a semiconductor chip are electrically connected by locating the semiconductor chip on the first surface 11 of the substrate 10.

Also, because a bus structure for applying electroplating is not used in the operations of forming the first metal layer 30 and the second metal layer 40, more in/out ports may be arranged and thus a circuit board having a fine circuit pattern may be precisely manufactured.

Figure 25:
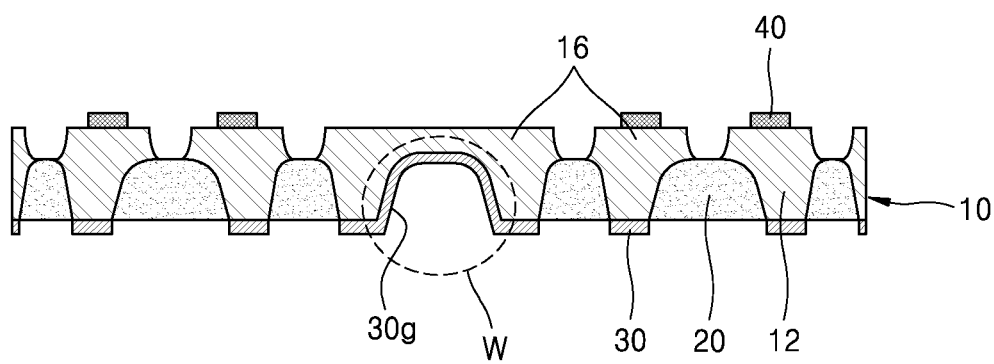
FIG. 25 is a cross-sectional view illustrating some operations of a method of manufacturing a circuit board according to another embodiment of the disclosure.

FIG. 25 is a cross-sectional view illustrating some operations of a method of manufacturing a circuit board according to another embodiment of the disclosure.

FIG. 25 is a cross-sectional view of the substrate 10 corresponding to an operation of forming the second metal layer 40 on the second surface 15 of the substrate 10 of FIG. 15 by using operations of a method of manufacturing a circuit board according to an embodiment of FIGS. 2 through 15.

Referring to FIG. 25, a wettable flank formed as a concave groove W is provided along with the pillar 12 in the first surface 11 of the substrate 10 when a portion of the first surface 11 of the substrate 10 is removed to form a plurality of pillars 12 on the first surface 11 of the substrate 10, and a flank metal layer 30g is formed to entirely cover the concave groove W when the first metal layer 30 is formed on the first surface 11 of the substrate 10, unlike in the method of manufacturing the circuit board according to an embodiment of FIGS. 2 through 15.

An automobile semiconductor is mounted on an automobile to be involved in controlling an operation of the automobile and process various information. When the automobile semiconductor is mounted on the automobile, sufficient wettability of a solder joint that electrically connects the automobile semiconductor to a control substrate should be ensured.

Operations of the method of manufacturing the circuit board according to the embodiment of FIG. 25 are some operations of manufacturing a circuit board for an automobile semiconductor, and the concave groove W formed in the first surface 11 of the substrate 10 corresponds to a wettable flank for ensuring wettability of a solder joint. To ensure sufficient wettability, a depth of the concave groove W may be equal to or greater than 0.100 mm.

According to a method of manufacturing a circuit board according the one or more embodiments of the disclosure, because an operation of forming a first metal layer and an operation of forming a second metal layer use different metal materials, excellent soldering performance of the circuit board may be achieved without performing a separate plating process when a semiconductor assembly process is performed, and thus, a firm electrical connection structure may be realized and improved soldering performance for electrical connection between a first surface of a substrate and a semiconductor chip may be achieved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of manufacturing a circuit board, the method comprising:
preparing a substrate having electrical conductivity;
removing a portion of a first surface of the substrate such that a plurality of pillars are formed on the first surface of the substrate after removing the portion of the first surface of the substrate;
locating an insulating material on the first surface of the substrate such that the insulating material covers a space between the plurality of pillars of the substrate after locating the insulating material on the first surface of the substrate;
forming a pattern on a second surface, which is opposite to the first surface of the substrate, by removing a portion of the second surface of the substrate;
forming a first metal layer on the first surface of the substrate; and
forming a second metal layer on the second surface of the substrate;
wherein the method further comprises, after the locating of the insulating material on the first surface and before the forming of the pattern on the second surface, curing the insulating material.

2. The method of claim 1, wherein the removing of the portion of the first surface comprises removing the portion of the first surface of the substrate by using a half-etching process.

3. The method of claim 2, wherein a thickness of a remaining portion of the substrate after the portion of the first surface of the substrate is removed by the removing of the portion of the first surface is equal or greater than 35 µm.

4. The method of claim 1, further comprising, between the removing of the portion of the first surface and the locating of the insulating material on the first surface of the substrate, performing surface treatment for roughening the first surface of the substrate by using a plating process or an etching process.

5. The method of claim 1, further comprising, after the curing of the insulating material and before the forming of the pattern on the second surface, removing a portion of the insulating material to expose an end surface of each pillar of the plurality of pillars.

6. The method of claim 5, wherein a height difference between an outer surface of the insulating material and the exposed end surface of a pillar of the plurality of pillars on the first surface of the substrate is less than 10 μm.

7. The method of claim 1, wherein the forming of the pattern on the second surface comprises locating a pattern mask corresponding to the pattern on the second surface and then performing an exposure process and a developing process, and removing the portion of the second surface of the substrate by spraying a copper chloride etching solution to the second surface of the substrate.

8. The method of claim 1, wherein the forming of the first metal layer and the forming of the second metal layer use different metal materials, so that the first metal layer and the second metal layer include different metal materials.

9. The method of claim 8, wherein the forming of the first metal layer comprises forming a second surface insulating layer by using an electrically insulating material to cover the second surface of the substrate, and locating the first metal layer on an end surface of each pillar of the plurality of pillars of the first surface of the substrate by using a plating method using at least one material selected from the group consisting of nickel, a nickel alloy, palladium, a palladium alloy, and a gold alloy.

10. The method of claim 9, wherein the forming of the first metal layer further comprises removing the second surface insulating layer after the locating of the first metal layer.

11. The method of claim 8, wherein the forming of the second metal layer comprises forming a first surface insulating layer by using an electrically insulating material to cover the first surface of the substrate, and locating the second metal layer on at least a portion of the pattern of the second surface of the substrate by using a plating method using a silver (Ag) material.

12. The method of claim 11, wherein the forming of the second metal layer further comprises removing the first surface insulating layer after the locating of the second metal layer comprising the silver material.

13. The method of claim 1, wherein the forming of the first metal layer comprises forming the first metal layer to cover the whole of an end surface of each of the plurality of pillars.

14. The method of claim 1, wherein the forming of the second metal layer comprises forming the second metal layer to cover at least a portion of the pattern of the second surface of the substrate.

15. The method of claim 8, wherein the forming of the first metal layer comprises forming a second surface temporary conductive layer on the second surface of the substrate, forming a second surface insulating layer to cover the second surface temporary conductive layer of the second surface of the substrate, and locating the first metal layer on an end surface of each pillar of the plurality of pillars of the first surface of the substrate by using a plating method using at least one material selected from the group consisting of nickel, a nickel alloy, palladium, a palladium alloy, and a gold alloy.

16. The method of claim 15, wherein the forming of the first metal layer comprises removing the second surface insulating layer and the second surface temporary conductive layer after the locating of the first metal layer.

17. The method of claim 8, wherein the forming of the second metal layer comprises forming a first surface temporary conductive layer on the first surface of the substrate, forming a first surface insulating layer to cover the first surface temporary conductive layer of the first surface of the substrate, and locating a second metal layer on at least a portion of the pattern of the second surface of the substrate by using a plating method using a silver (Ag) material.

18. The method of claim 17, wherein the forming of the second metal layer further comprises removing the first surface insulating layer and the first surface temporary conductive layer after the forming of the second metal layer comprising the silver material.

19. The method of claim 1, wherein the removing of the portion of the first surface of the substrate comprises forming a wettable flank as a concave groove along with the plurality of pillars in a remaining portion of the first surface of the substrate.

* * * * *